United States Patent
Wu et al.

(10) Patent No.: US 7,193,325 B2
(45) Date of Patent: Mar. 20, 2007

(54) RELIABILITY IMPROVEMENT OF SIOC ETCH WITH TRIMETHYLSILANE GAS PASSIVATION IN CU DAMASCENE INTERCONNECTS

(75) Inventors: Zhen-Cheng Wu, Hsinchu (TW); Bi-Troug Chen, Jiangjyun Township, Tainon County (TW); Weng Chang, Hsin-Chu (TW); Syun-Ming Jang, Hsin-Chu (TW); Su-Horng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 156 days.

(21) Appl. No.: 10/835,788

(22) Filed: Apr. 30, 2004

(65) Prior Publication Data
US 2005/0245100 A1    Nov. 3, 2005

(51) Int. Cl.
*H01L 23/48* (2006.01)
(52) U.S. Cl. .................. 257/760; 257/751; 257/758
(58) Field of Classification Search ............... 257/751, 257/758, 760
See application file for complete search history.

(56) References Cited

U.S. PATENT DOCUMENTS

| 6,436,808 B1 | 8/2002 | Ngo et al. |
| 6,436,824 B1 | 8/2002 | Chooi et al. |
| 6,528,116 B1 | 3/2003 | Pokharna et al. |
| 6,541,367 B1 | 4/2003 | Mandal |
| 6,617,690 B1 * | 9/2003 | Gates et al. ............... 257/758 |
| 6,991,959 B2 * | 1/2006 | Goundar et al. ........... 438/105 |

* cited by examiner

*Primary Examiner*—Doug Menz
(74) *Attorney, Agent, or Firm*—Haynes and Boone, LLP (57) ABSTRACT

A method of forming a SiCOH etch stop layer in a copper damascene process is described. A substrate with an exposed metal layer is treated with $H_2$ or $NH_3$ plasma to remove metal oxides. Trimethylsilane is flowed into a chamber with no RF power at about 350° C. to form at least a monolayer on the exposed metal layer. The SiCOH layer is formed by a PECVD process including trimethylsilane and $CO_2$ source gases. Optionally, a composite SiCOH layer comprised of a low compressive stress layer on a high compressive stress layer is formed on the substrate. A conventional damascene sequence is then used to form a second metal layer on the exposed metal layer. Via Rc stability is improved and a lower leakage current is achieved with the trimethylsilane passivation layer. A composite SiCOH etch stop layer provides improved stress migration resistance compared to a single low stress SiCOH layer.

13 Claims, 11 Drawing Sheets

RELIABILITY IMPROVEMENT OF SIOC ETCH WITH TRIMETHYLSILANE GAS PASSIVATION IN CU DAMASCENE INTERCONNECTS

FIELD OF THE INVENTION

The invention relates to the field of fabricating integrated circuits and other electronic devices and in particular to a lower cost method of making a copper interconnect with improved reliability and less leakage current.

BACKGROUND OF THE INVENTION

The manufacture of an integrated circuit in a semiconductor device involves the formation of a metal layer which is overlaid on another conductive layer to form a wiring pattern. This process is usually repeated several times to produce a stack of metal layers. Metal interconnects which form horizontal and vertical electrical pathways in the device are separated by dielectric layers to prevent crosstalk between the metal wiring that can degrade device performance by slowing circuit speed.

A popular method of making an interconnect structure is a damascene process in which an opening is formed in a stack of dielectric layers. In a single damascene scheme, the opening which is a via, contact hole, or a trench is lined with a diffusion barrier layer and is filled with a metal. For a dual damascene process, a via and a trench are formed in a stack of dielectric layers, lined with a diffusion barrier layer, and are simultaneously filled with metal. The most frequently used dual damascene approach is a via first process in which a via is fabricated and then a trench is formed above the via. Recent improvements in damascene processing include lowering the resistivity of the metal interconnect by switching from aluminum to copper as the metal layer and reducing the dielectric constant (k) of dielectric materials to minimize capacitance coupling between the metal interconnects. Conventional dielectric materials such as $SiO_2$ have a k value of about 4 or larger but new technologies require a k value of below 3.5 and preferably less than 3.

One of the more promising low k dielectric materials is organosilicate glass (OSG) also known as SiCO which is oxygen doped silicon carbide. When SiCO has a significant hydrogen content, it is also referred to as SiCOH which is available as Black Diamond™ from Applied Materials, CORAL™ from Novellus, or can be obtained by different trade names from other manufacturers. For example, Black Diamond has been analyzed by RBS (Rutherford Back Scattering) to have a composition of about 20 atomic weight % silicon, about 30 at. wt. % oxygen, about 9 at. wt. % carbon, and about 36 at. wt. % hydrogen. SiCOH has a k value between about 2 and 3 and thereby provides a much needed reduction in capacitance coupling between wiring. The composition and properties of SiCOH may vary depending on deposition conditions and source gases. Typically, a silane and an oxidizing gas are flowed into a heated process chamber where a chemical vapor deposition (CVD) or a plasma enhanced CVD (PECVD) process occurs. Optionally, a single precursor may function as the silicon, carbon/hydrogen, and oxygen source gas and is usually assisted into the process chamber with an inert carrier gas.

One concern with a SiCOH dielectric layer in a damascene scheme is that the layer is porous even after heating to a temperature of 500° C. or more. A porous structure will allow moisture uptake which increases the dielectric constant and defeats the purpose of depositing a low k dielectric layer. Therefore, post-deposition treatments are frequently performed to densify the SiCOH layer and stabilize its properties during subsequent processing. A well known method of densifying a SiCOH layer is to use a plasma treatment such as the $N_2/NH_3$ plasma process found in U.S. Pat. No. 6,436,808. Besides stabilizing the dielectric constant, densification also improves SiCOH resistance to etchants such as $O_2$ plasma during removal of a photoresist mask that is used to transfer a trench pattern into the damascene stack.

Silicon nitride or silicon carbide (SiC) are commonly employed as a barrier or etch stop layer in a damascene process. For example, a stack of dielectric layers that includes a low k dielectric layer on a SiC etch stop layer is formed on substrate that may have an exposed metal layer. However, the advantage of a low k dielectric layer is partially offset by a relatively high k value for a SiC or silicon nitride etch stop layer.

Figure 1:
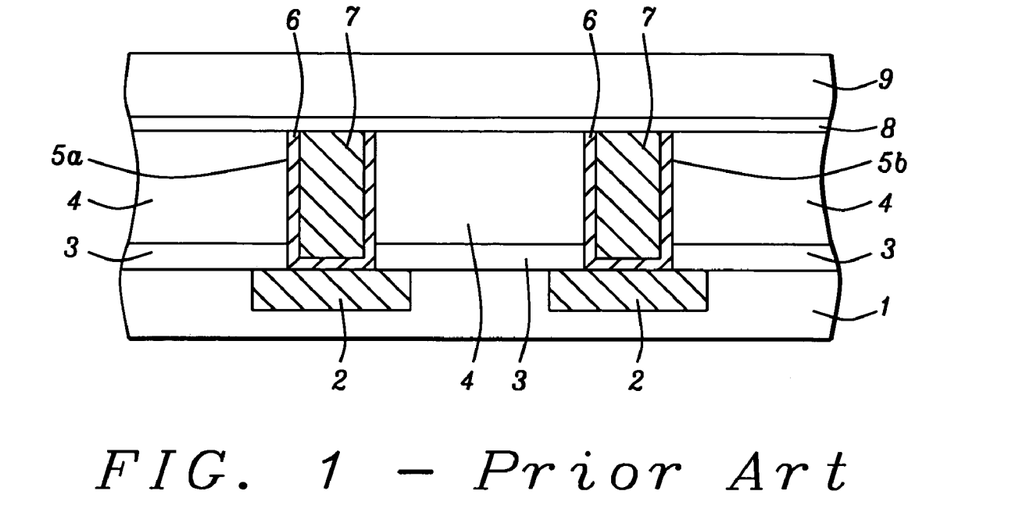
FIG. 1 is a cross-sectional view depicting a composite etch stop layer consisting of a SiCOH layer on a lower SiC layer formed on a substrate according to a prior art method.

A compromise solution is reached in a prior art method depicted in FIG. 1. A substrate 1 is provided that contains a first metal layer 2 which may be adjoined on its sides and bottom by a diffusion barrier layer (not shown). An etch stop layer 3 such as SiC or silicon nitride and a low k dielectric layer 4 are sequentially formed on substrate 1. Conventional methods are used to form vias 5a, 5b in a first low k dielectric layer 4 and in etch stop layer 3 that are aligned above the first metal layer 2. The vias are lined with a diffusion barrier layer 6 and filled with a second metal layer 7 which is planarized to be coplanar with the first low k dielectric layer 4. As a first step in a damascene process to form the next metal layer, a thin (20–50 Angstrom thick) SiC layer 8 is deposited on the first low k dielectric layer 4 followed by deposition of a SiCOH layer 9 with a thickness of about 550 Angstroms. Although the composite etch stop layer comprised of SiC layer 8 and SiCOH layer 9 provides a lower dielectric constant than SiC only, the formation of the SiC layer has a low throughput because of a low deposition rate of about 1 Angstrom/sec. Furthermore, large process instability is observed due to SiC thickness variations that result in poor wafer to wafer and within wafer reliability control.

Figure 2:
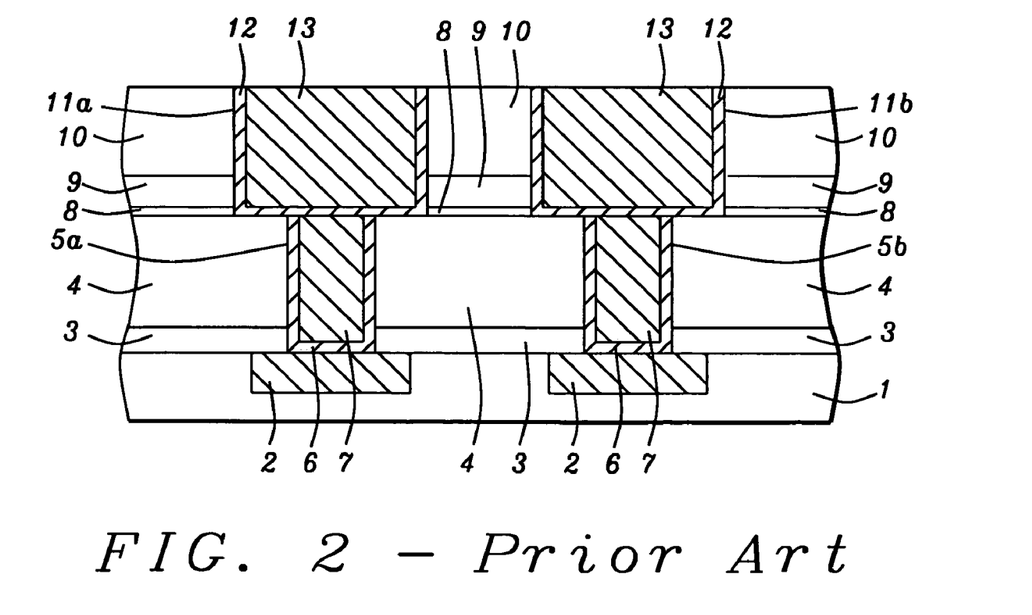
FIG. 2 is a cross-sectional view showing a diffusion barrier layer and a metal layer formed within an opening in the composite etch stop layer depicted in FIG. 1.

Referring to FIG. 2, a second low k dielectric layer 10 is deposited on SiCOH layer 9. Conventional methods are employed to form openings 11a, 11b in the second low k dielectric layer 10 that extend through SiCOH layer 9 and SiC layer 8 above vias 5a, 5b. A diffusion barrier layer 12 that is Ta, for example, is deposited on the sidewalls and bottom of openings 11a, 11b. A metal such as copper is deposited to fill openings 11a, 11b to form a third metal layer 13 that is subsequently planarized to be coplanar with the second low k dielectric layer 10.

An alternative barrier layer which is hydrogenated SiC is described in U.S. Pat. No. 6,541,367. In one example, the SiCH layer serves as an etch stop and a nano-porous $SiO_2$ dielectric layer is deposited on the SiCH layer. Although an amorphous SiCH film has a lower dielectric constant (k~4.5) than silicon nitride (k~7), α-SiCH has a higher current leakage level under high bias and a lower breakdown field than silicon nitride.

In U.S. Pat. No. 6,436,824, a carbon doped silicon nitride layer with a dielectric constant of less than 3 is used as an etch stop layer. While SiCN can improve the leakage performance, trace amounts of amines in SiCN have a tendency to poison a photoresist layer in a via hole during patterning of a trench opening in a via first dual damascene scheme. Thus, a non-nitrogen containing etch stop layer is preferred.

In U.S. Pat. No. 6,528,116, a substrate is first treated with free atomic hydrogen to remove $Al_2O_3$ on an aluminum layer and then carbon doped $SiO_2$ is deposited as a dielectric layer. A thermal process is preferred over a CVD or plasma enhanced CVD method to achieve a lower k value for the carbon doped $SiO_2$ layer. In some applications, however, adhesion of the SiCOH dielectric layer to the substrate may suffer because of a lack of a barrier layer that functions as a glue layer.

SUMMARY OF THE INVENTION

An objective of the present invention is to reduce leakage current in a semiconductor device and particularly in metal layers that are fabricated by a damascene process.

A further objective of the present invention is to enhance throughput in a damascene method while lowering the cost of the process.

A still further objective of the present invention is to improve via Rc stability in a semiconductor device by employing a SiCOH barrier/etch stop layer in a damascene method.

Yet another objective of the present invention is to provide improved wafer to wafer and within wafer reliability control by minimizing process instability from etch stop layer thickness variations.

Still another objective of the present invention is to provide an improved method of forming an etch stop layer in a damascene process that is compatible with existing tools and processes.

These objectives are achieved in a first embodiment by depositing a SiCOH etch stop layer on a substrate that has been passivated with an organosilane layer. A substrate is provided which has a first metal layer formed within a stack of dielectric layers that includes a first low k dielectric layer on a first etch stop layer. The substrate is first treated with hydrogen plasma to remove any metal oxides on the surface of the exposed first metal layer which is preferably copper. Alternatively, the substrate is treated with $NH_3$ plasma to remove metal oxides on the exposed first metal surface.

A key sequence involves flowing an organosilane that is preferably trimethylsilane in a CVD process chamber to contact the substrate and deposit at least a monolayer of organosilane to passivate the substrate surface without striking a plasma. A vacuum is then applied to remove organosilane that is not absorbed on the substrate surface. Next, a SiCOH etch stop layer is deposited in the same process chamber with a plasma enhanced CVD process that includes trimethylsilane as the silicon source gas and $CO_2$ as the oxygen source gas. The SiCOH etch stop layer does not need to be densified with a plasma treatment or other methods.

Conventional methods are then followed to deposit a second low k dielectric layer on the SiCOH layer, form an opening in the stack consisting of the second low k dielectric layer and the SiCOH etch stop layer, deposit a diffusion barrier layer and a copper layer to fill the opening, and planarize the copper layer and diffusion barrier layer to complete the damascene scheme.

In a second embodiment, a composite etch stop layer comprised of a first SiCOH layer with a high compressive stress and a second SiCOH layer with a low compressive stress is employed in a damascene scheme. The process flow is similar to that described in the first embodiment except that the first deposition step in the PECVD process chamber is to form the bottom layer in a composite SiCOH etch stop layer. A first SiCOH layer with a high compressive stress is formed by a process comprised of flowing trimethylsilane, He, and $CO_2$ into a PECVD process chamber and applying a RF power. A second SiCOH layer with a low compressive stress is then deposited on the first SiCOH layer in the same process chamber by a PECVD process that includes flowing trimethylsilane and $CO_2$ into the process chamber. The present invention is also the composite SiCOH etch stop layer formed by the aforementioned method.

DETAILED DESCRIPTION OF THE INVENTION

The present invention is a method of forming a SiCOH etch stop layer in a damascene scheme that improves the performance and reliability of the resulting metal interconnect. The method may be used to form one or more of a plurality of metal layers in a stack of metal layers on a semiconductor substrate. The SiCOH etch stop layer according to the present invention may be incorporated in a single or a dual damascene method.

Those skilled in the art will appreciate that a SiCOH etch stop layer deposited according to the present invention could also be formed on metal lines in a gap fill process (not shown). For example, a SiCOH etch stop layer formed according to the first or second embodiment may be deposited as a conformal layer on the top surfaces and sidewalls of etched metal lines and then a thicker dielectric layer such as fluorosilicate glass may be deposited on the SiCOH etch stop layer to fill the gaps between the metal lines as appreciated by those skilled in the art.

Figure 3:
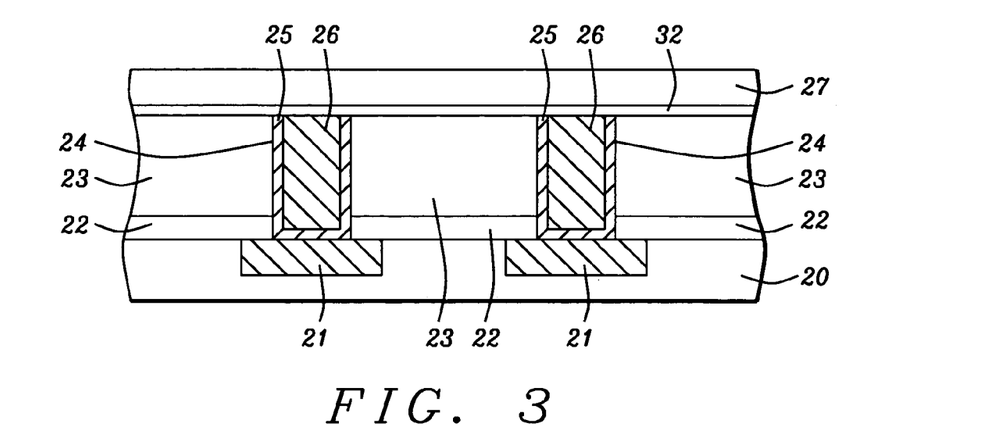
FIG. 3 is cross-sectional view showing a SiCOH etch stop layer formed on a substrate according to the present invention.

The drawings are provided by way of example and are not intended to limit the scope of the invention. A first embodiment is described in FIGS. 3–10. Referring to FIG. 3, a substrate 20 is provided that is typically monocrystalline silicon but also may be based on silicon-germanium, gallium-arsenide, or silicon-on-insulator technology. Substrate 20 usually contains active and passive devices (not shown). In one embodiment, the substrate 20 is also comprised of a conductive layer 21 that may be W, Al, Al/Cu or copper. The conductive layer 21 typically includes a plurality of metal lines and each metal line may be bounded on the sides and bottom by a diffusion barrier layer (not shown). A planarization method such as a chemical mechanical polish step is performed so that the conductive layer 21 is coplanar with the top surface of the substrate 20.

A stack of dielectric layers that include a first etch stop layer 22 and a first low k dielectric layer 23 are sequentially deposited by CVD, plasma enhanced CVD (PECVD), or a spin-on technique on the substrate 20. The first etch stop layer 22 is comprised of silicon carbide, silicon nitride, or silicon oxynitride while the first low k dielectric layer 23 is preferably comprised of a low k dielectric material that is fluorine doped $SiO_2$, carbon doped $SiO_2$, hydrogen silsesquioxane (HSQ), methyl silsesquioxane (MSQ), a fluorinated polyimide, a poly(arylether), or benzocyclobutene. Carbon doped $SiO_2$ will hereafter be referred to as SiCOH which is commercially available by various trade names such as Black Diamond™ from Applied Materials, COREL™ from Novellus, and HOSP from Allied Signal. Additional processing of the first low k dielectric layer 23 may include a high temperature cure and a plasma treatment known to those skilled in the art in order to densify the layer for stabilization purposes.

In an alternative embodiment, a cap layer (not shown) may be deposited on the first low k dielectric layer 23. The cap layer is preferably silicon nitride or silicon oxynitride and becomes the top layer in the stack of dielectric layers on substrate 20.

A conventional method is used to form openings 24 such as trenches in the stack of dielectric layers which are aligned above the conductive layer 21. The openings 24 are typically formed by patterning a photoresist layer (not shown) on the first low k dielectric layer 23 and using the photoresist as a mask while plasma etching the pattern through the first low k dielectric layer 23 and etch stop layer 22. A conformal diffusion barrier layer 25 comprised of one or more of Ta, TaN, TaSiN, Ti, TiN, W, or WN is deposited on the sidewalls and bottom of the openings 24. A metal that is preferably copper is deposited on diffusion barrier layer 25 and planarized to form the first metal layer 26 which may be comprised of metal lines, for example, and in the exemplary embodiment is coplanar with the first low k dielectric layer 23.

A key feature of the first embodiment of the present invention is that a conventional SiC, SiN, or SiON etch stop layer also known as a glue layer in a damascene process flow is replaced by a composite layer comprised of a bottom layer which is an organosilane layer and an upper oxide containing etch stop layer. The organosilane layer serves as a passivation layer and an adhesion promoter. The inventors have discovered that annealing or "soaking" a substrate, particularly one in which the first metal layer 26 is copper, with an organosilane that is preferably trimethylsilane serves to passivate the copper and provide excellent adhesion for a subsequently deposited oxide containing etch stop layer. In the exemplary process flow, an organosilane layer 32 such as trimethylsilane is absorbed to form at least a monolayer thickness on the diffusion barrier layer 25, first low k dielectric layer 23, and on the first metal layer 26 by flowing an organosilane into a CVD process chamber containing the substrate 20. Next, an oxide containing etch stop layer 27 that is preferably SiCOH is deposited on the organosilane layer 32 in the same CVD process chamber in which the trimethylsilane treatment was performed. In the preferred embodiment, a SiCOH thickness of about 400 to 550 Angstroms is formed. Note that a thicker SiCOH etch stop layer 27 of about 550 Angstroms is generally required for a later metal level such as M9 than for a first metal level (M1) where a thinner 400 Angstrom thick SiCOH etch stop layer may be employed as appreciated by those skilled in the art.

Figure 6:
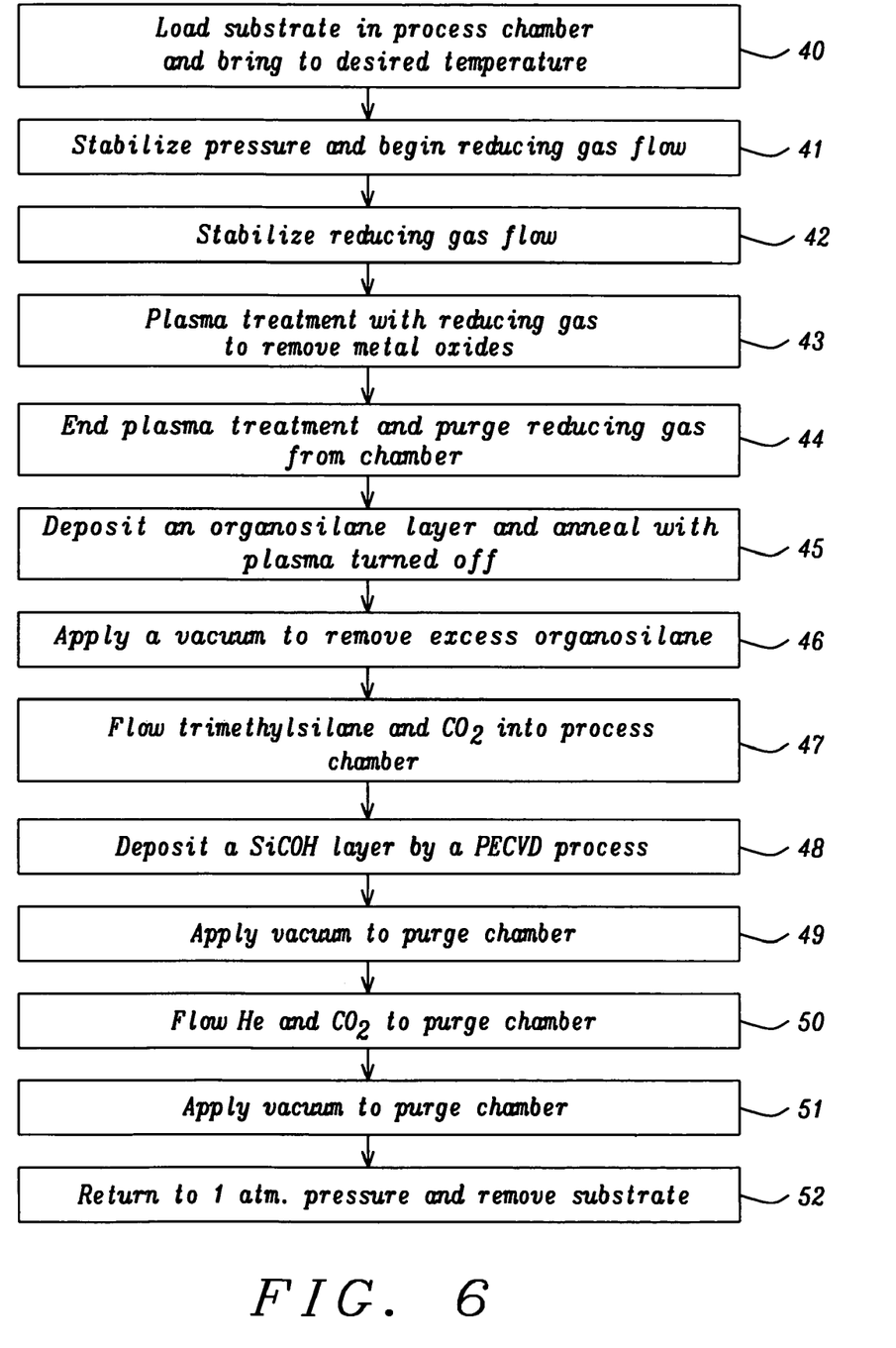
FIG. 6 is a flow chart that shows the various steps in a process sequence to form a SiCOH etch stop layer according to the first embodiment of the present invention.

A process sequence that encompasses the various steps involved in forming the SiCOH etch stop layer according to the first embodiment is depicted in FIG. 6. In step 40, the substrate 20 with the first metal layer 26 formed in the first low k dielectric layer 23 and in etch stop layer 22 is loaded into a PECVD chamber and is positioned on a pedestal or chuck. In one embodiment, the PECVD chamber is part of an Applied Materials PECVD cluster tool such as Producer SE. Optionally, another PECVD process tool with multiple process chambers may be utilized. The process chamber and substrate are heated during a 60 second period to a temperature in the range of 300° C. to 400° C. and preferably to about 350° C. which is maintained during the entire process sequence. A vacuum is also applied to remove resident gases in the process chamber and to lower the pressure to an acceptable level during step 40.

In step 41, a first stabilization step is performed in which hydrogen at a flow rate of about 1800 standard cubic centimeters per minute (sccm) is flowed into the chamber to provide a pressure of about 1.5 to 4.5 Torr for a period of about 8 seconds. Step 42 is a second stabilization step in which the hydrogen flow rate is decreased to about 100 to 600 sccm while the pressure remains in the range of 1.5 to 4.5 Torr for a period of about 15 seconds. Step 43 is a hydrogen plasma treatment that is used to reduce oxides that form on the surface of the first metal layer 26 during exposure to air while in handling and storage. A high frequency RF (HFRF) power of from 100 to 500 Watts and preferably 300 watts is employed with a $H_2$ flow rate of about 100 to 600 sccm and a chamber pressure of about 1.5 to 4.5 Torr for a period of about 10 to 30 seconds. In step 44, a vacuum is applied to the process chamber for approximately 6 seconds to remove $H_2$ and any gaseous by-products from the reduction process in step 43.

In an alternative embodiment, the $H_2$ in steps 41–43 is replaced by $NH_3$ and the same process conditions are employed to provide a reducing environment for removing oxides on the first metal layer 26. Those skilled in the art will appreciate that other plasma treatments involving other gases such as $N_2H_4$ or gas mixtures including $H_2$ and $NH_3$ will be equally effective in removing metal oxides from the first metal layer 26.

Step 45 is a key feature of the present invention and is comprised of an organosilane that is preferably trimethylsilane (3MS) which is flowed into the PECVD process chamber at a rate of between 100 and 500 sccm and preferably 470 sccm for about 5 to 100 seconds and preferably for about 7 seconds to provide a pressure of about 1 to 3 Torr and preferably 1.7 Torr. Step 45 is referred to as a soaking or annealing process and may be considered a CVD process since no plasma is employed. In one embodiment, the organosilane vapor contacts the exposed surface of the first metal layer 26, diffusion barrier layer 25, and the first low k dielectric layer 23 where an organosilane layer 32 with at least a monolayer thickness is formed. The organosilane layer 32 serves to passivate the metal in the first metal layer 26 and acts as an adhesion promoter during a subsequent step of depositing a SiCOH etch stop layer 27. The organosilane layer 32 is also annealed in step 45 since the substrate is maintained at a temperature between 300° C. and 400° C.

In an alternative embodiment, another organosilane such as $(CH_3)_2SiH_2$ (2MS), $CH_3SiH_3$ (1MS) or $(CH_3)_4Si$ (4MS) may be flowed into the chamber in step 45 to form the organosilane layer 32. Optionally, an inert carrier gas may be included in step 45.

Step 46 involves applying a vacuum to the PECVD process chamber for about 6 seconds to remove any organosilane that is not absorbed on the surface of the first metal layer 26, diffusion barrier layer 25, or on the first low k dielectric layer 23.

Steps 47–49 are a sequence in which an oxide containing etch stop layer is deposited on the organosilane layer 32 formed in the previous step. In the exemplary embodiment, the oxide containing etch stop layer is a SiCOH layer 27. However, other oxide containing etch stop layers such as SiCO, SiCNO, and SiNO may be deposited instead of SiCOH on the organosilane layer 32. In step 47, the CVD process chamber is stabilized at a pressure of about 1.7 Torr with a trimethylsilane flow rate of about 50 to 300 sccm and preferably 100 sccm, and a $CO_2$ flow rate of from 200 to 500 sccm and preferably 350 sccm for a period of about 20 seconds. Step 47 serves to equilibrate the chamber and no SiCOH layer is deposited. A plasma is struck in step 48 by applying a HFRF power of from 200 to 600 Watts and preferably 400 Watts, and a low frequency RF (LFRF) power of 50 to 200 Watts and preferably 100 Watts while the trimethylsilane and $CO_2$ flow rates are maintained in the range of 50 to 300 sccm and 200 to 500 sccm, respectively. The spacing between the upper and lower electrodes (not shown) is preferably 410 mil. Step 48 deposits the SiCOH etch stop layer 27 and is continued until an acceptable SiCOH thickness of between about 400 and 550 Angstroms is achieved. For a preferred thickness of 550 Angstroms, the deposition period lasts about 23.7 seconds. The SiCOH etch stop layer 27 deposited by this method is also called an NH layer by the inventors.

Optionally, a SiCOH etch stop layer 27 which is also called an HDx layer by the inventors is deposited in steps 47, 48 using a second set of conditions. In one embodiment, the process chamber is stabilized at a pressure between about 1.5 and 4.5 Torr with a trimethylsilane flow rate of about 50 to 200 sccm, a He flow rate of about 200 to 600 sccm, and a $CO_2$ flow rate of about 100 to 500 sccm in step 47. A plasma is struck in step 48 at a temperature between 300° C. and 400° C. and preferably about 350° C. and with the aforementioned gas flow rates by applying a HFRF power of between 200 and 600 W and a LFRF power from about 100 to 300 W. Using these conditions, the preferred SiCOH thickness of 550 Angstroms is deposited in about 17.2 seconds. The SiCOH etch stop layer 27 referred to as an NH layer has different properties than the HDx layer formed by the alternative method. For instance, the HDx layer has a higher density, greater compressive stress, and better moisture resistance than the NH layer but the NH layer has better leakage performance. However, either a HDx layer or an NH layer may be employed as the SiCOH etch stop layer 27 in the present invention.

Alternatively, other oxidizing gases such as $O_2$, $N_2O$, CO, or $O_3$ may be used in place of $CO_2$ for steps 47 and 48 in the SiCOH etch stop layer 27 deposition.

In another embodiment, a SiCOH etch stop layer 27 may be deposited by replacing trimethylsilane as the silicon source gas and replacing $CO_2$ as the oxygen source gas in steps 47, 48. Those skilled in the art will appreciate that other organosilanes may be used in combination with one of the aforementioned oxidizing gases to produce a SiCOH layer. Optionally, an inert carrier gas may also be included in the SiCOH deposition process. In yet another embodiment, a precursor compound containing Si, C, O, and H may serve as the source gas for a SiCOH deposition with an optional inert gas as a carrier gas. Note that the % of the Si, C, H, and O components in a SiCOH etch stop layer may 27 vary somewhat depending upon the source gas, deposition conditions, and the design of the PECVD process chamber.

After the SiCOH etch stop layer 27 is deposited in step 48, the HFRF power and LFRF power are returned to 0 and a vacuum is applied in step 49 for about 6 seconds to remove all gases from the process chamber. The SiCOH deposition process is completed in steps 50 and 51. In step 50, an inert gas such as He is flowed into the PECVD process chamber at a rate of about 7000 sccm while $CO_2$ is flowed at a rate of about 2900 sccm to give a chamber pressure of approximately 8 Torr for a period of about 20 seconds. Step 50 may actually be divided into as many as five intervals in which $CO_2$ and He flow rates are gradually increased. Step 51 is a repeat of step 49 except that a vacuum is applied for about 10 seconds to remove all gases from the PECVD process chamber. In an alternative embodiment, the steps 50, 51 are omitted from the process sequence. Finally, in step 52, the process chamber is returned to near 1 atmosphere pressure by flowing $N_2$ into the chamber. Once the chamber is returned to an appropriate pressure, the substrate 20 is removed for further processing.

Note that the $H_2$ plasma treatment, the annealing process, and the SiCOH etch stop deposition may be performed in the same process chamber to optimize throughput. Furthermore, throughput in the method of the present invention is increased over prior art methods that require a SiC etch stop (glue) layer which is formed at a slow rate of about 1 Angstrom/sec. Process time can be reduced by about 45 seconds or 16% by replacing the prior art sequence of $H_2$ plasma treatment, SiC deposition, and SiCOH deposition that forms a composite SiCOH/SiC etch stop layer with steps 40–52 of the first embodiment to form a SiCOH etch stop layer on an organosilane passivation layer. Since steps 40–52 are performed in existing equipment with no additional costs, the increased throughput of approximately 45 seconds per substrate represents a substantial savings in the overall damascene process. The savings may be increased by twofold or more by repeating the damascene process of the present invention to fabricate one or more additional metal layers that are sequentially overlaid on one another on the same substrate.

Figure 4:
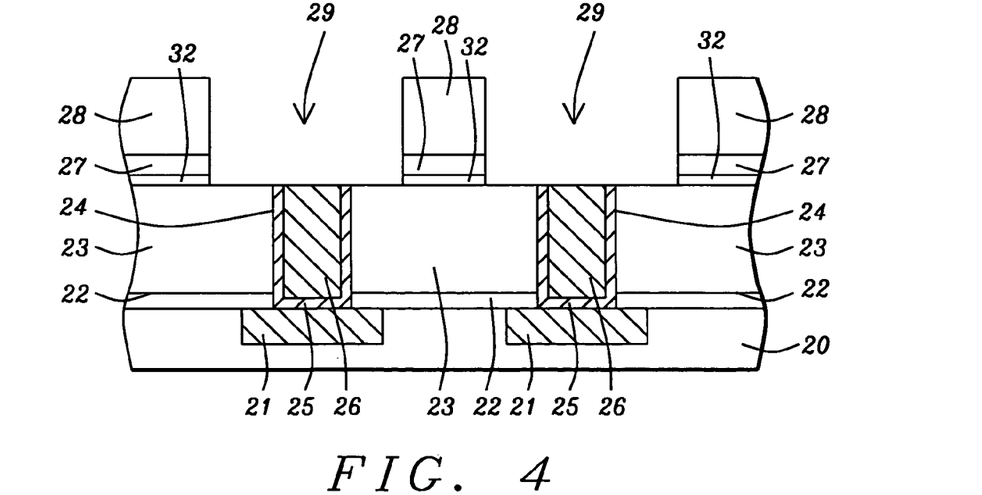
FIG. 4 is a cross-sectional view after a dielectric layer is deposited on the SiCOH etch stop layer in FIG. 3 and an opening is formed above an underlying via.

Referring to FIG. 4, a second low k dielectric layer 28 is formed on the SiCOH etch stop layer 27 by a CVD, PECVD, or spin-on technique and has a thickness of about 5500 to 7000 Angstroms. The second low k dielectric layer 28 is typically selected from the same group of low k dielectric materials mentioned previously that may be used in the first low k dielectric layer 23. In one embodiment, when the second low k dielectric layer 28 is deposited by a PECVD process, the second low k dielectric layer may be deposited in the same process chamber as the SiCOH etch stop layer 27. Similar to the process that formed the first low k dielectric layer 23, the second low k dielectric layer 28 may be subjected to a post-deposition treatment that can include heating and a plasma process to densify the low k dielectric layer and render it more impervious to absorption of moisture and other polar airborne compounds.

A conventional process is then performed that typically includes a photoresist patterning and etching sequence to generate openings 29 that may be trenches, for example. Optionally, an opening 29 may be a trench formed above a via in a dual damascene scheme. The openings 29 extend through the second low k dielectric layer 28, the SiCOH etch stop layer 27, and organosilane layer 32 and are aligned above the first metal layer 26 which is also called M1.

Figure 5:
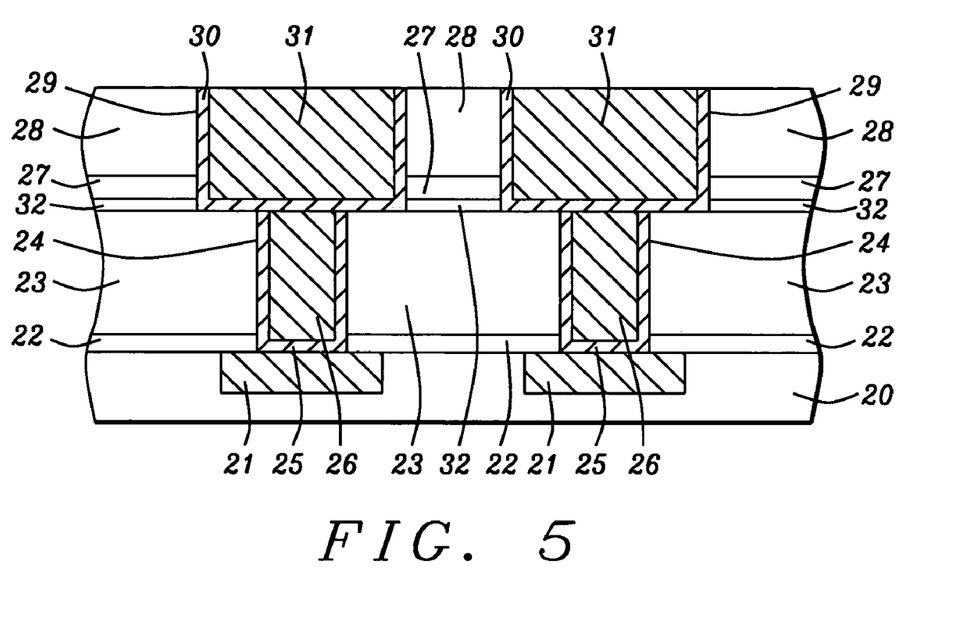
FIG. 5 is a cross-sectional view showing a diffusion barrier layer and a metal layer formed in the dielectric layer and SiCOH etch stop layer depicted in FIG. 4.

Referring to FIG. 5, a second diffusion barrier layer 30 is deposited to form a conformal layer on the sidewalls and bottom of the openings 29. The second diffusion barrier layer 30 is comprised of one or more of Ta, TaN, TaSiN, Ti, TiN, W, or WN. A second metal layer 31 which is preferably copper is deposited by an electroplating or physical vapor deposition method to fill the openings 29. A planarization step is carried out so that the second metal layer 31 is coplanar with the second low k dielectric layer 28 to complete the damascene process. Note that in a dual damascene structure (not shown), only the trench portion of the opening 29 is referred to as the second metal layer 31 or M2 while the underlying via between M1 and M2 is typically called V1.

Figure 7A:
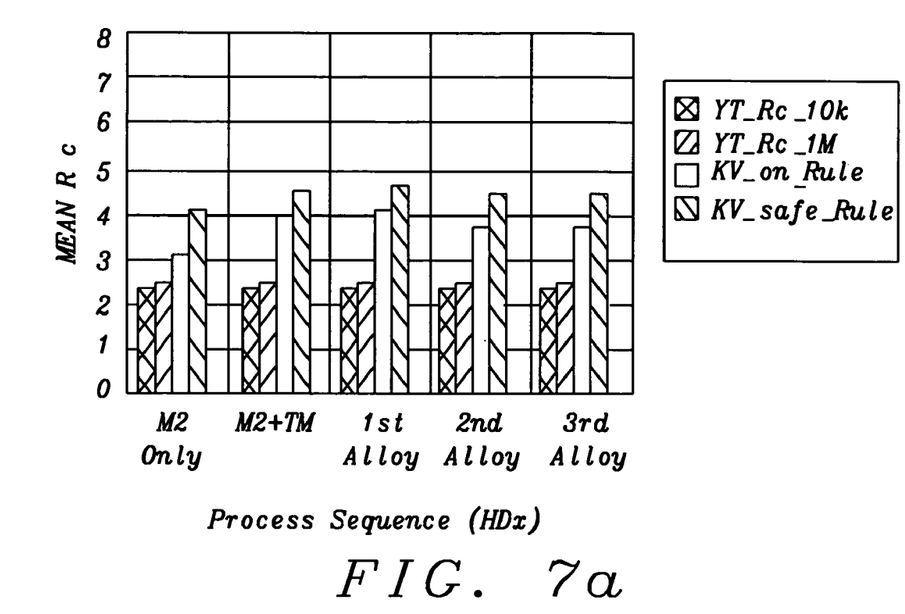
FIG. 7a is a plot showing Rc values for a metal interconnect that is fabricated with a conventional (SiCOH/SiC) etch stop layer which is formed by a first method.
Figure 7B:
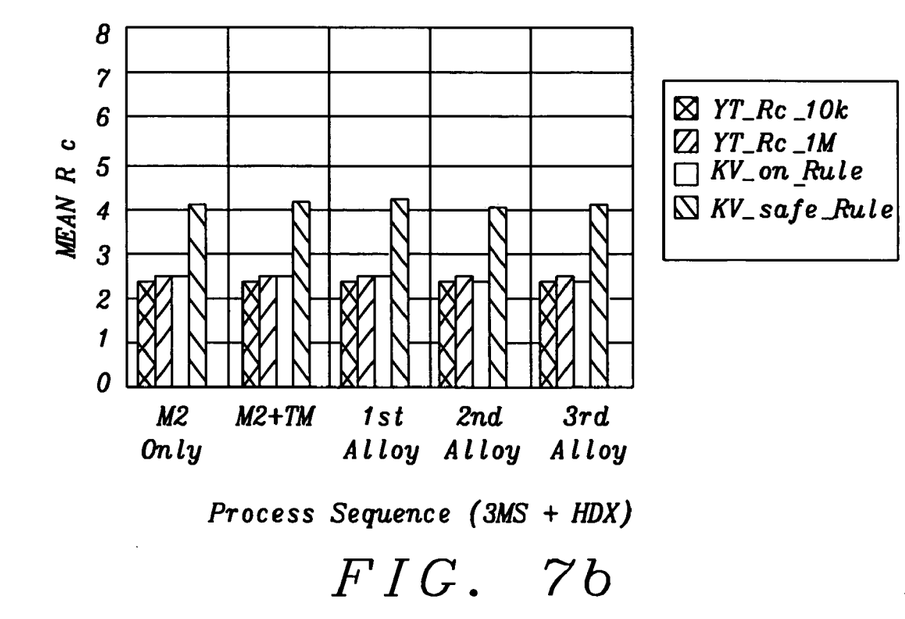
FIG. 7b is a plot showing Rc values for a metal interconnect that is fabricated with a composite etch stop layer according to the first embodiment of the present invention.

One advantage of the method of the present invention is illustrated in FIGS. 7a and 7b which are plots of via Rc for various metal layer stacks starting at a second metal layer (M2 only) followed by successively adding the metal layers identified as top metal (TM), first alloy, second alloy, and third alloy. The bars within each process sequence represent different metal pattern densities. FIG. 7a shows results from a process previously practiced by the inventors in which a SiCOH layer is deposited with an HDx process on a SiC layer to form a composite (SiCOH/SiC) etch stop layer in a damascene structure that has a second metal layer (M2) above a via (V1) and first metal layer (M1). In comparison, FIG. 7b shows the results when a 3MS layer and SiCOH etch stop layer (HDx layer) are sequentially formed in the metal stack according to the first embodiment. Note that Rc values are significantly lower for most metal stacks where the (3MS+HDx) process sequence of the present invention is used in the damascene scheme. Furthermore, for a given pattern density, the Rc value is more uniform from stack to stack for metal layers fabricated by the (3MS+HDx) method. In other words, there is a higher Rc stability in a stack of metal layers formed by the present invention.

Figure 8A:
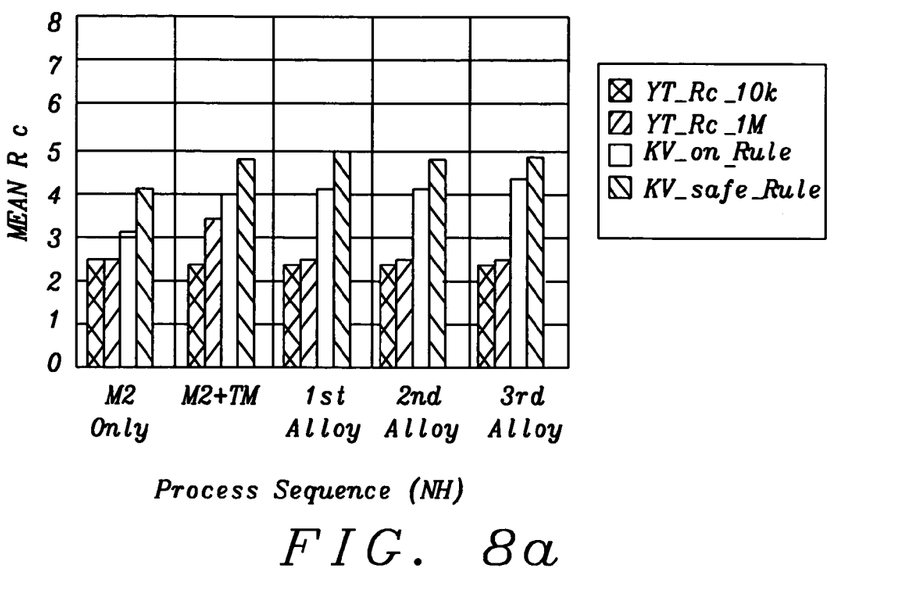
FIG. 8a is a plot showing Rc values for a metal interconnect that is fabricated with a conventional (SiCOH/SiC) etch stop layer formed by a second method.
Figure 8B:
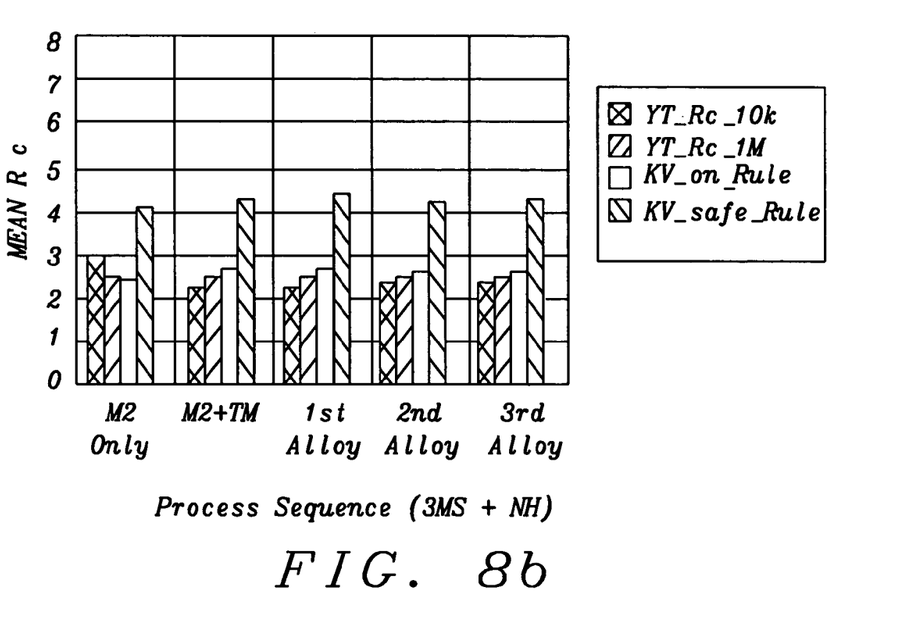
FIG. 8b is a plot showing Rc values for a metal interconnect that is fabricated with a composite etch stop layer of the present invention according to the first embodiment.

Likewise, in FIGS. 8a and 8b, a plot of via Rc for various metal stacks is illustrated. FIG. 8a shows results from a process previously practiced by the inventors in which a SiCOH layer is deposited with an NH process on a SiC layer to form a composite (SiCOH/SiC) etch stop layer in a damascene structure that has a second metal layer (M2) above a via (V1) and first metal layer (M1). In comparison, FIG. 8b shows the results when a 3MS layer and SiCOH etch stop layer (NH layer) are sequentially formed in a metal stack according to the first embodiment. For most pattern densities, Rc is significantly lower when the damascene structure is fabricated with a (3MS+NH) process of the first embodiment.

Figure 9:
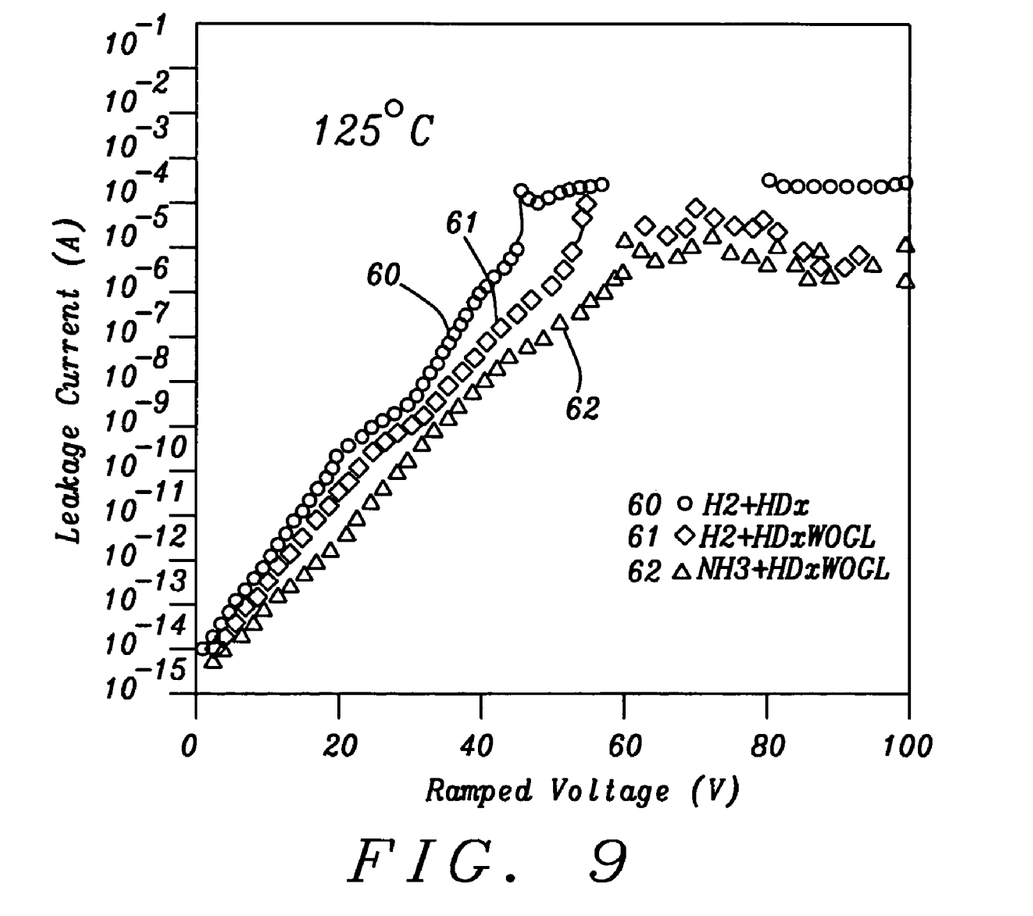
FIGS. 9 and 10 are plots of leakage current vs. ramped voltage for interconnects fabricated with a conventional etch stop layer and with a SiCOH etch stop layer according to the first embodiment of the present invention.

A semiconductor device fabricated with a damascene method that involves formation of a SiCOH etch stop layer according to the first embodiment also has a lower leakage current than when a prior art SiCOH/SiC composite etch stop layer is employed. The top curve 60 in FIG. 9 shows the relationship between leakage current and voltage in a damascene structure that was fabricated by a prior art process sequence practiced by the inventors in which a first metal layer is treated with $H_2$ plasma followed by depositing a composite SiC/SiCOH (HDx) etch stop layer on the treated first metal layer. Curve 61 shows that leakage current is reduced when the first metal layer is treated with $H_2$ plasma followed by sequentially forming an organosilane layer and SiCOH etch stop layer (HDx layer) on the first metal layer according to the present invention. Curve 62 indicates that leakage current is further reduced by replacing the $H_2$ plasma with an $NH_3$ plasma treatment and then forming the organosilane layer and SiCOH (HDx) etch stop layer according to the first embodiment.

Figure 10:
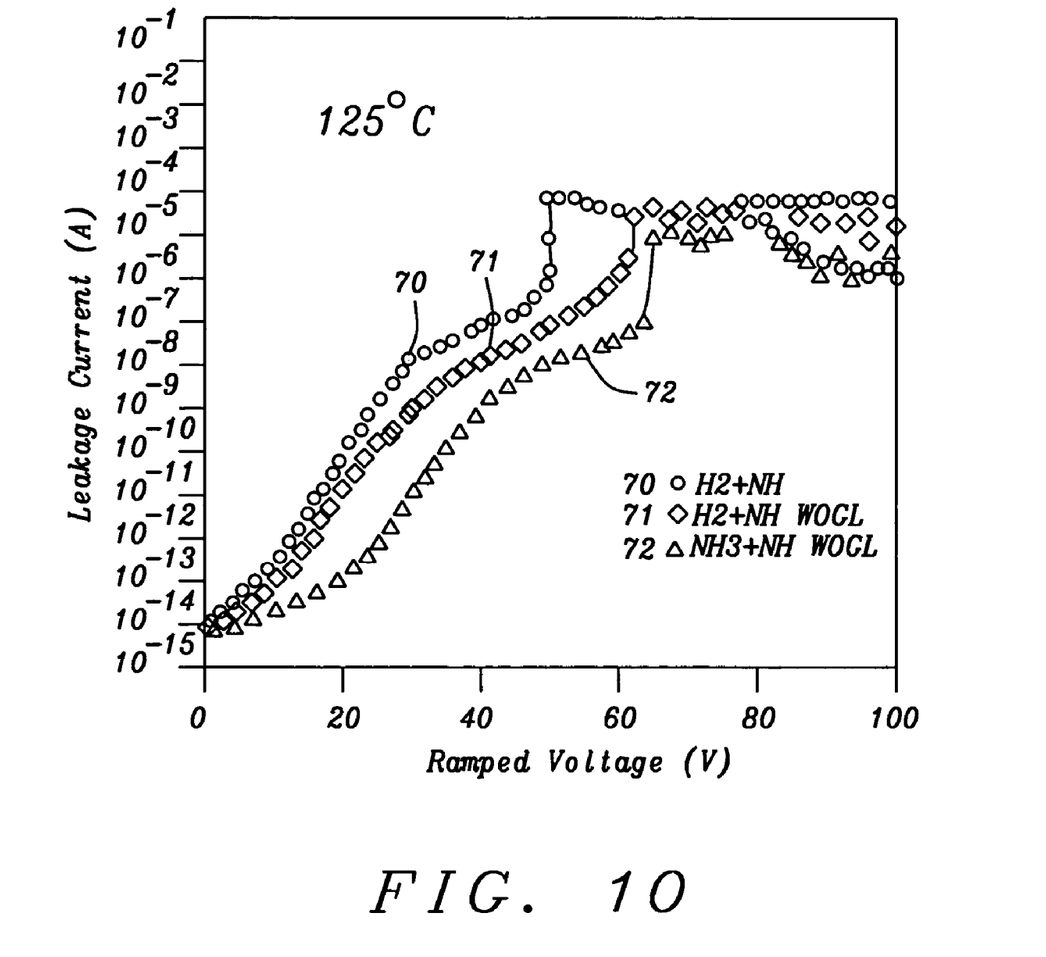

The top curve 70 in FIG. 10 shows the relationship between leakage current and voltage in a damascene structure that was fabricated by a prior art process sequence practiced by the inventors in which a first metal layer is treated with $H_2$ plasma followed by depositing a composite SiC/SiCOH(NH) etch stop layer on the treated first metal layer. Curve 71 shows that leakage current is reduced when the first metal layer is treated with $H_2$ plasma followed by sequentially forming an organosilane layer and SiCOH(NH) etch stop layer on the first metal layer. Curve 72 indicates that leakage current is further reduced by replacing the $H_2$ plasma with an $NH_3$ plasma treatment and then forming the organosilane layer and SiCOH(NH) etch stop layer according to the first embodiment. It is understood that the damascene structure comprises a second metal layer formed above the first metal layer and in the SiCOH etch stop layer. Another benefit of the present invention is a higher time dependent dielectric breakdown (TDDB) lifetime as shown in Table 1. The second and fourth columns show TDDB lifetime test results for the SiCOH/SiC etch stop layers that were used to generate the Rc data in FIGS. 7a and 8a, respectively. Third and fifth columns indicate significant improvements in TDDB lifetime when the organosilane layer/SiCOH etch stop layer combination of the present invention that was used to generate the data in FIGS. 7b and 8b, respectively, replaces the SiCOH/SiC etch stop layer in a damascene structure. The results were obtained with an applied voltage of between 2 and 4 mv/cm and at a temperature between 150° C. and 250° C.

TABLE 1

TDDB Lifetime Test Results

| Beta | HDx | 3MS + HDx | NH | 3MS + NH |
|---|---|---|---|---|
| t63 (sec.) | 2.93 E + 03 | 6.35 E + 05 | 1.62 E + 04 | 9.26 E + 05 |
| $t_{0.1}$ (sec.) | 3.42 E + 00 | 1.10 E + 04 | 3.63 E + 01 | 3.55 E + 03 |
| T63 lifetime (yr.) @ 3.6 V, 125° C. | 2.47 E + 07 | 5.35 E + 09 | 1.37 E + 08 | 7.80 E + 09 |
| T63 lifetime (yr.) @ 2.75 V, 125° C. | 4.93 E + 07 | 1.07 E + 10 | 2.73 E + 08 | 1.56 E + 10 |
| T0.1 lifetime (yr.) @ 3.6 V, 125° C. | 2.88 E + 04 | 9.30 E + 07 | 3.06 E + 05 | 2.99 E + 07 |
| T0.1 lifetime (yr.) @ 2.75 V, 125° C. | 5.76 E + 04 | 1.86 E + 08 | 6.11 E + 05 | 5.98 E + 07 |

In a second embodiment, a method is described for forming a composite SiCOH etch stop layer comprised of a lower first SiCOH layer with a high compressive stress and an upper second SiCOH layer having a low compressive stress in a damascene structure. A poor stress migration performance is observed in copper damascene structures comprised of a single SiCOH etch stop layer having a low compressive stress of about −2 E+9 dynes/cm$^2$ when a so-called hump pattern is present in the device designs. A hump pattern is defined as a configuration in which a lower first metal layer such as M1 having a large surface area is connected by a via to an upper second metal layer such as M2 with a smaller surface area. For example, an M1 layer may have a length of about 20 microns and a variable width of 5 to 15 microns while an M2 layer has a much smaller length of 0.14 microns which will be explained later with respect to FIG. 14. The second embodiment is illustrated in FIGS. 11–14 and involves the formation of a composite SiCOH etch stop layer above a first metal layer that is subsequently connected by a via to a second metal layer. However, other applications of forming a composite SiCOH etch stop layer on a first metal layer are possible such as in a configuration where a second metal layer directly contacts a first metal layer.

The inventors have discovered that a composite SiCOH etch stop layer comprised of a lower SiCOH layer having a high compressive stress of about −3.3 E+9 dynes/cm$^2$ and an upper SiCOH layer with a low compressive stress of about −2 E+9 dynes/cm$^2$ improves stress migration performance of a metal interconnect. Note that the lower SiCOH etch stop layer is hereafter referred to as the first SiCOH layer and the upper SiCOH etch stop layer is hereafter referred to as the second SiCOH layer.

Figure 11:
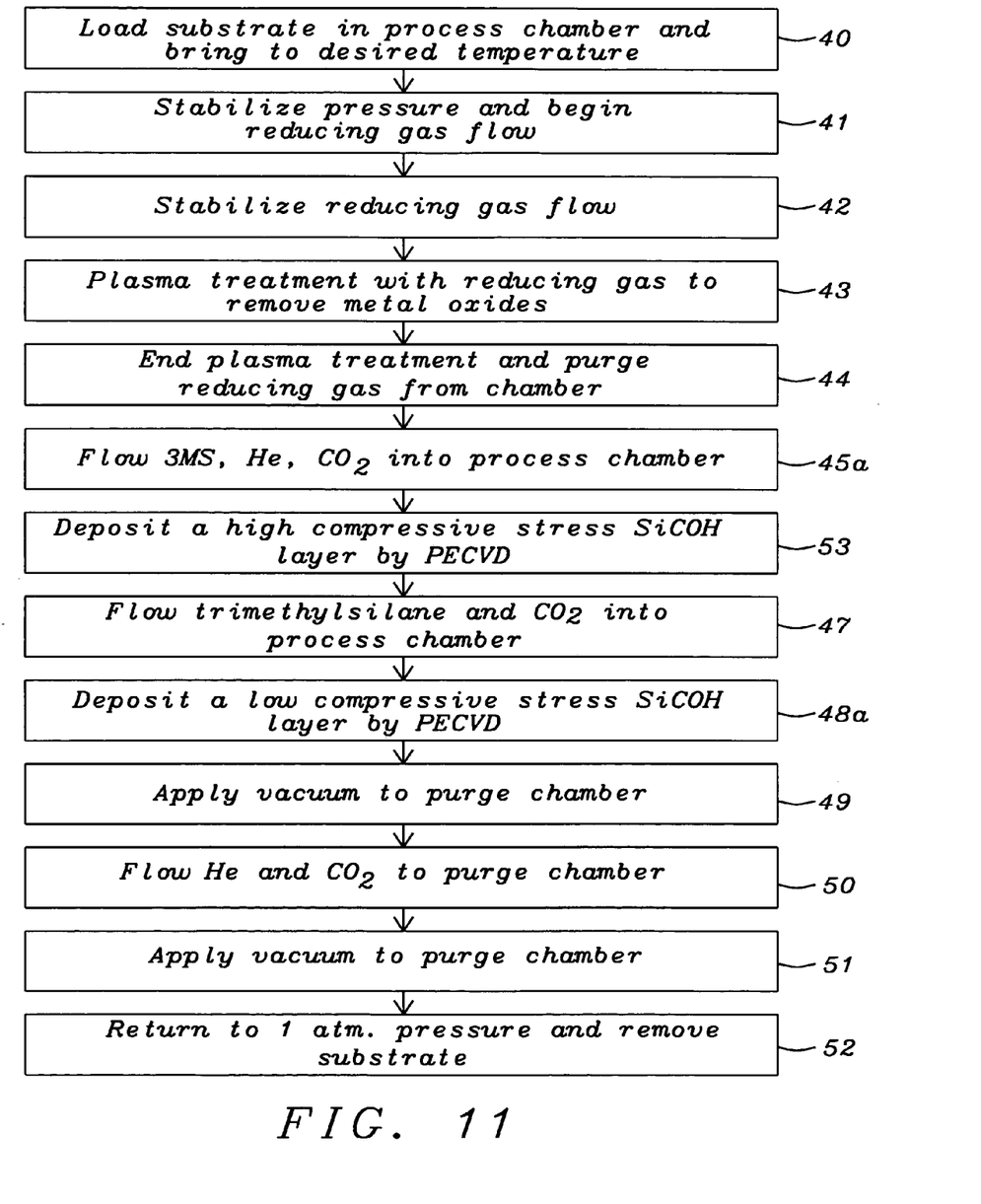
FIG. 11 is a flow chart that shows the various steps in a process sequence to form a SiCOH etch stop layer according to the second embodiment of the present invention.
Figure 12:
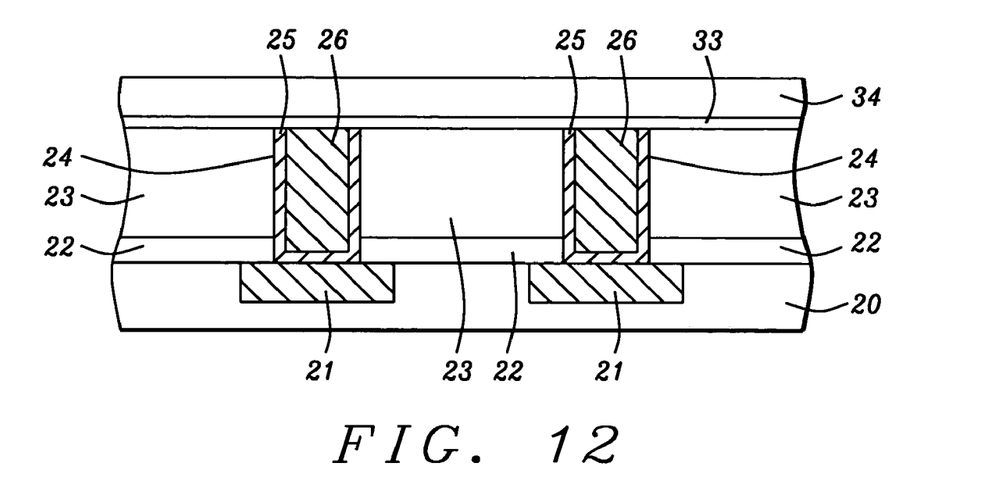
FIGS. 12 and 13 depict a damascene process involving a composite SiCOH etch stop layer according to the second embodiment of the present invention.

Referring to FIG. 12, the substrate 20, conductive layer 21, first etch stop layer 22, first dielectric layer 23, diffusion barrier layer 25, and first metal layer 26 which were described previously are shown. An exemplary process flow of the second embodiment is illustrated in FIG. 11 and involves the sequence of steps 40–44, 45a, 53, 47, 48a–52. Steps 40–44 were previously described and involve loading the substrate 20 in a process chamber and treatment with a reducing gas to remove surface oxides on the first metal layer 26.

In steps 45a and 53, a key feature of the second embodiment is formation of a first SiCOH layer 33 having a compressive stress of about −3.3 E+9 dynes/cm$^2$ on the first dielectric layer 23, diffusion barrier layer 25, and on the first metal layer 26. In step 45a, a gas mixture comprised of helium, an organosilicon gas which is preferably trimethylsilane (3MS), and an oxidizer gas that is preferably $CO_2$ is flowed into the chamber until a stable pressure is achieved. The gas flows are continued in step 53 while a plasma is generated by applying a HFRF power and a LFRF power to carry out the deposition process.

The first SiCOH layer 33 has a thickness of about 100 to 200 Angstroms and preferably about 150 Angstroms and is formed in a process chamber of a PECVD tool such as an Applied Materials Producer SE with multiple process chambers. In a preferred embodiment, the process comprises a 3MS flow rate of about 50 to 200 sccm, a He flow rate of about 200 to 600 sccm, a $CO_2$ flow rate of about 100 to 500 sccm, a chamber pressure from about 1.5 to 4.5 Torr, a chamber temperature between about 300° C. and 400° C., a HFRF power of from 200 to 600 Watts, and a LFRF power from about 100 to 300 Watts and is performed for a period of about 4.6 to 17.2 seconds to deposit the first SiCOH layer 33. More preferably, the process conditions comprise a 100 sccm 3MS flow rate, a 400 sccm He flow rate, a 350 sccm $CO_2$ flow rate with a 3.5 Torr chamber pressure, a 350° C. chamber temperature, a 400 W HFRF power, a 200 W LFRF power with a 410 mil spacing between upper and lower electrodes. The first SiCOH layer 33 has a high compressive stress of about −2.5 to −4 E+9 dynes/cm$^2$ and has been previously referred to as an HDx layer in the first embodiment.

Those skilled in the art will appreciate that other organosilanes such as tetramethylsilane (4MS), dimethylsilane (2MS), and methylsilane (1MS) may be used in place of 3MS and other oxidizing gases such as $O_2$, $O_3$, CO, and $H_2O_2$ may be used instead of $CO_2$ during steps 45a, 53. Optionally, a precursor compound containing Si, C, O, and H may serve as the source gas for depositing the first SiCOH layer 33.

A second SiCOH layer 34 with a low compressive stress is formed on the first SiCOH etch stop layer 33 by performing steps 47, 48a. In step 47, the HFRF power and LFRF power are stopped and the same organosilane gas used in steps 45a, 53 is flowed into the process chamber at the rate of 50 to 300 sccm with $CO_2$ at a flow rate of 200 to 500 scam to purge the He gas and achieve a stable chamber pressure of about 1.7 Torr. A plasma is struck in step 48a by applying a HFRF power of from 300 to 500 Watts and preferably 400 Watts and a low frequency RF (LFRF) power of 50 to 200 Watts and preferably 100 Watts while the 3MS and $CO_2$ flow rates are maintained in the same range as in step 47. In this embodiment, a slightly shorter deposition time of about 18.1 to 23.2 seconds is preferred for step 48a compared to previously described step 48 in the first embodiment in order to form a preferred thickness of about 400 Angstroms for the second SiCOH layer 34. However, the deposition time may vary depending on the thickness of the first SiCOH layer 33. For example, if the first SiCOH layer thickness is greater than 150 Angstroms, then the second SiCOH layer thickness is preferably less than 400 Angstroms in order to achieve a desired thickness of about 550 Angstroms for the composite etch stop layer comprised of first and second SiCOH layers 33, 34. The second SiCOH layer 34 has a relatively low compressive stress of about −1.5 to −2.5 E+9 dynes/cm$^2$ and was previously referred to as an NH layer in the first embodiment.

The remaining steps 49–52 are carried out as described previously. Note that the $H_2$ plasma treatment and the SiCOH layer depositions are preferably performed in the same process chamber to optimize throughput. Furthermore, throughput is increased over prior art methods that have a composite SiCOH/SiC etch stop layer where SiC is formed at a slow rate of about 1 Angstrom/sec. Process time can be reduced by about 45 seconds or 16% by replacing a SiCOH/SiC composite etch stop layer previously employed by the inventors with the composite SiCOH etch stop layer according to the second embodiment. Since the method of the second embodiment is performed in existing equipment with no additional costs, an increased throughput of 45 seconds per substrate represents a substantial savings in the overall damascene process. The savings may be increased by twofold or more by repeating the damascene process of the present invention to fabricate one or more additional metal layers that are overlaid on one another as appreciated by those skilled in the art.

Figure 13:
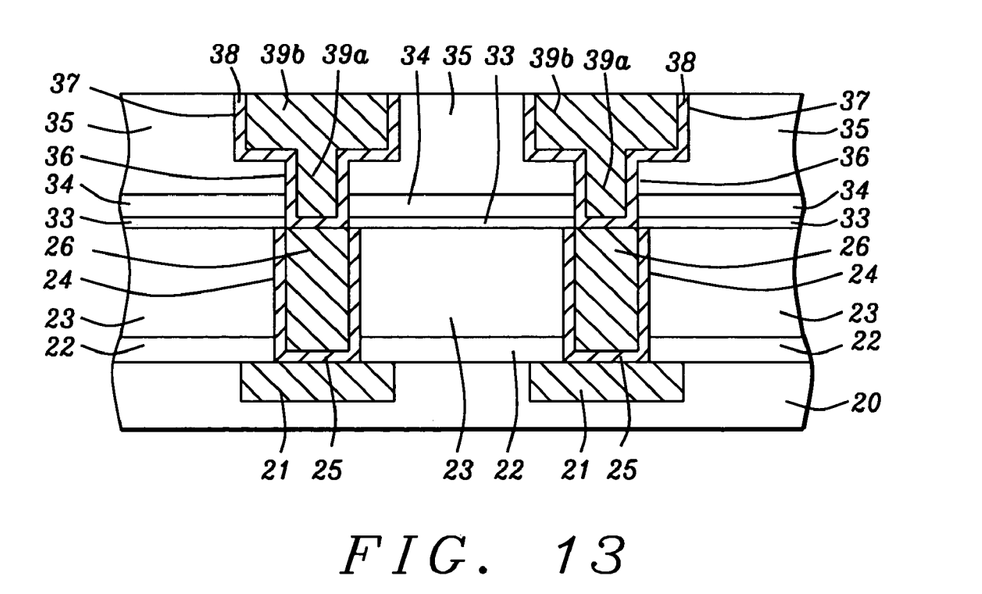

Referring the FIG. 13, a dual damascene process may be completed by a conventional method. For example, a second dielectric layer 35 is formed on the second SiCOH etch stop layer 34 and is preferably comprised of the same low k dielectric material as in the first low k dielectric layer 23. A via pattern and an overlying trench pattern are formed in the second dielectric layer 35 by a well known method. As a result, a trench 37 is formed above each via 36 and a via 36 is aligned above each first metal layer 26. It is understood that other dual damascene patterns may be formed which may be employed in the present invention. A conformal second diffusion barrier layer 38 is deposited in the vias 36 and trenches 37 and may be comprised of one or more of Ta, TaN, TaSiN, Ti, TiN, W, or WN. Then a metal such as copper is deposited on the second diffusion barrier 38 to fill the vias 36 and trenches 37. A planarization process that typically involves one or more CMP steps is used to generate vias 39a and a second metal layer 39b that are coplanar with the top of the second low k dielectric layer 35.

Figure 14:
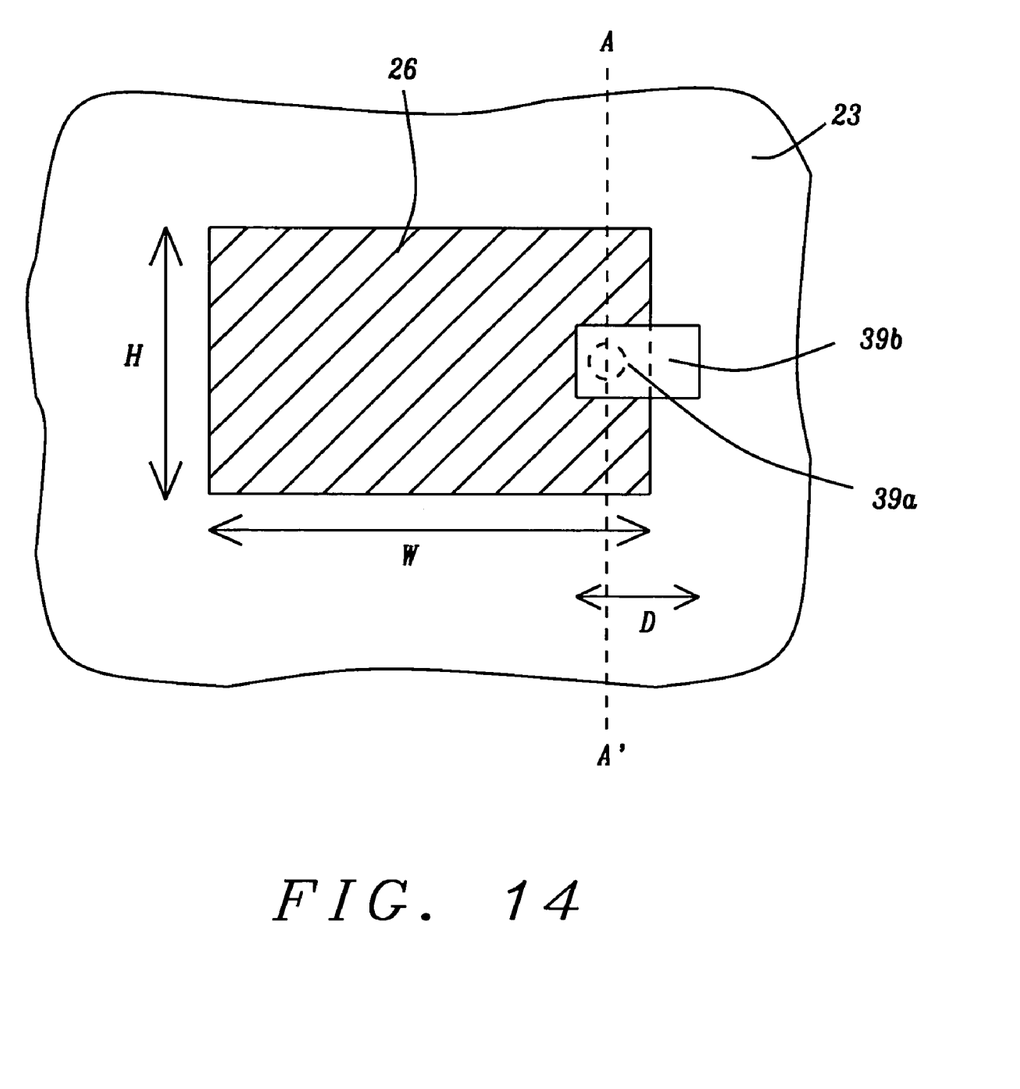
FIG. 14 is a top-down view of the metal layers in the damascene structure shown in FIG. 13.

Referring to FIG. 14, a top-down view of the structure in FIG. 13 is shown in which the second low k dielectric layer 35 and first and second SiCOH layers 33, 34 have been removed in order to reveal the relative sizes of the metal layers in a hump design. The cross-sectional view in FIG. 13 is obtained from the plane A–A'. In this embodiment, the length W and width H of the first metal (M1) layer 26 formed in the first low k dielectric layer 23 are larger than the length D of the second metal (M2) layer 39b. The via 39a typically has a circular shape and is below the second metal layer 39b.

Another advantage of the composite SiCOH etch stop layer of the second embodiment is that stress migration resistance is improved without compromising other reliability characteristics including electromigration, leakage, and Rc stability. For example, the "New ES" results shown in Table 2 are a measurement of stress migration performance in which a damascene structure that includes a via such as via 39a in FIG. 14 is heated at 175° C. for 500 hours. It is understood that the composite etch stop layer comprised of first and second SiCOH layers 33, 34 in addition to the second low k dielectric layer 35 and second diffusion barrier layer 38 are present during the stress testing. The results in the second and third columns under "Old ES" are for a damascene structure previously fabricated by the inventors which includes a via such as via 39a but where the high compressive etch stop layer 33 is omitted and only a low compressive etch stop layer 34 is present on the first metal layer 26.

In a typical stress test, a 1 mA current is passed through a via and resistance is measured at a time=0 before the stress test and after 500 hours of stress. In this example, a total number of 18 vias were tested for each "Old ES" and "New ES" design and the number of vias are shown in which the resistance increases by >50% and by >100% after 500 hours of stress. Note that a resistance increase of more than 50% is considered a defect which will lower reliability and device performance. There is a significant improvement in nearly every hump design where the length W of an M1 layer (metal layer 26) is varied from 3 to 20 microns and the width H is varied from 3 to 20 microns as shown in FIG. 14. The thicknesses of the first metal layer 26 and second metal layer 39b are typically between about 2.0 and 4.0 microns.

TABLE 2

Stress Migration Test (V1) Results (175° C./500 hours)

| M1 Dimension | Old ES (>50%) | Old ES (>100%) | New ES (>50%) | New ES (>100%) |
|---|---|---|---|---|
| 20 um W × 5 um H | 5 | 5 | 0 | 0 |
| 20 um W × 3 um H | 2 | 2 | 0 | 0 |
| 10 um W × 5 um H | 3 | 3 | 0 | 0 |
| 5 um W × 10 um H | 2 | 2 | 0 | 0 |
| 3 um W × 20 um H | 0 | 0 | 1 | 1 |
| 3 um W × 10 um H | 3 | 2 | 0 | 0 |

While this invention has been particularly shown and described with reference to, the preferred embodiments thereof, it will be understood by those skilled in the art that various changes in form and details may be made without departing from the spirit and scope of this invention.

We claim:

1. A composite etch stop layer formed in an interconnect structure on a substrate, comprising;
    (a) a first SiCOH layer having a high compressive stress formed on said substrate; and
    (b) a second SiCOH layer having a low compressive stress formed on said first SiCOH layer.

2. The composite etch stop layer of claim 1 wherein the first SiCOH layer has a compressive stress of about −2.5 to −4 E+9 dynes/cm$^2$.

3. The composite etch stop layer of claim 1 wherein the first SiCOH layer has a thickness of about 100 to 200 Angstroms.

4. The composite etch stop layer of claim 1 wherein the second SiCOH layer has a compressive stress of about −1.5 to −2.5 E+9 dynes/cm$^2$.

5. The composite etch stop layer of claim 1 wherein the first SiCOH layer has a compressive stress of about −3.3 E+9 dynes/cm$^2$ and the second SiCOH layer has a compressive stress of about −2 E+9 dynes/cm$^2$.

6. The composite etch stop layer of claim 1 wherein the second SiCOH layer has a thickness of about 350 to 450 Angstroms.

7. The composite etch stop layer of claim 1 wherein the combined thickness of said first and second SiCOH layers is between about 550 Angstroms.

8. The composite etch stop layer of claim 1 wherein said substrate is comprised of an exposed metal layer.

9. The composite etch stop layer of claim 8 wherein said metal layer is comprised of copper.

10. A semiconductor device, comprising:
    a substrate;
    a dielectric layer disposed on the substrate;
    an first SiCOH layer formed on the dielectric layer, wherein the first SiCOH layer has a first compressive stress; and
    a second SiCOH layer formed on the first SiCOH layer, wherein the second SiCOH layer has a second compressive stress that is less than the first compressive stress.

11. The device of claim 10, further comprising a metal layer disposed on the dielectric layer.

12. The device of claim 11, wherein the first SiCOH layer is formed on the metal layer and the dielectric layer.

13. The device of claim 11, wherein the metal layer comprises copper.

* * * * *